United States Patent
Liu et al.

(10) Patent No.: US 10,902,158 B2
(45) Date of Patent: Jan. 26, 2021

(54) DAYLIGHT LIVABILITY INDEX FROM IMAGES

(71) Applicant: International Business Machines Corporation, Armonk, NY (US)

(72) Inventors: Su Liu, Austin, TX (US); Howard N. Anglin, Leander, TX (US); Shi Kun Li, Shanghai (CN); Cheng Xu, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 527 days.

(21) Appl. No.: 15/814,840

(22) Filed: Nov. 16, 2017

(65) Prior Publication Data

US 2019/0147115 A1  May 16, 2019

(51) Int. Cl.
| | | |
|---|---|---|
| *G06F 30/13* | (2020.01) | |
| *G06T 11/00* | (2006.01) | |
| *G06Q 50/16* | (2012.01) | |
| *G06F 30/20* | (2020.01) | |
| *G06T 15/04* | (2011.01) | |
| *G06Q 10/10* | (2012.01) | |
| *G06T 19/20* | (2011.01) | |
| *G06T 15/50* | (2011.01) | |

(52) U.S. Cl.
CPC .............. *G06F 30/13* (2020.01); *G06F 30/20* (2020.01); *G06Q 10/101* (2013.01); *G06Q 50/16* (2013.01); *G06T 11/001* (2013.01); *G06T 15/04* (2013.01); *G06T 15/50* (2013.01); *G06T 19/20* (2013.01)

(58) Field of Classification Search
CPC ....... G06F 30/13; G06F 30/20; G06Q 10/101; G06Q 50/16; G06T 11/001; G06T 15/04; G06T 15/50; G06T 19/20
USPC .......................................................... 703/1
See application file for complete search history.

(56) References Cited

U.S. PATENT DOCUMENTS

| | | | |
|---|---|---|---|
| 9,367,954 B2 | 6/2016 | Mueller | |
| 10,062,205 B2 * | 8/2018 | Eikhoff | ............... G06F 16/5854 |

(Continued)

FOREIGN PATENT DOCUMENTS

| | | |
|---|---|---|
| JP | 08220980 A | 8/1996 |
| JP | 2010151728 A | 7/2010 |

(Continued)

OTHER PUBLICATIONS

Anca D. Galasiu and Morad R. Atif, Applicabilityof daylighting computer modeling in real case studies: comparison between measured and simulated daylight availability and lighting consumption, Building and Environment 37 (2002) 363-377 (Year: 2002).*

(Continued)

*Primary Examiner* — Justin C Mikowski
(74) *Attorney, Agent, or Firm* — Daniel C. Housley

(57) ABSTRACT

An image of a building may be received from a client device, and the building in the image may be geo-located and identified. Based on the geo-location, a set of attributes for the building may be determined. A user query may be received from the client device, and based on a property of the user query, a unit in the building may be identified. A daylight livability index (DLLI) for the unit may be determined, based on the identified unit and the set of attributes for the building, and the user may be notified of the DLLI.

17 Claims, 6 Drawing Sheets

(56) References Cited

U.S. PATENT DOCUMENTS

2010/0325563 A1* 12/2010 Goldthwaite ....... G06F 3/04815
715/757
2012/0173209 A1 7/2012 Krebs et al.
2016/0171403 A1* 6/2016 Shen ..................... G06Q 10/06
705/7.22

FOREIGN PATENT DOCUMENTS

JP 2016017295 A 2/2016
WO 2016154306 A1 9/2016

OTHER PUBLICATIONS

Dariusz Masly et. al., The Impact of Solar Radiation on the Quality of Buildings: Research Methods, M. Antona and C. Stephanidis (Eds.): UAHCI 2015, Part N, LNCS 9178, pp. 322-331, 2015. (Year: 2015).*

Christoph F. Reinhart and Jan Wienold, The daylighting dashboard e A simulation-based design analysis for daylit spaces, Building and Environment 46 (2011) 386e396 (Year: 2011).*

Dilay Kesten et. al., Evaluation of daylight performance in scale models and full-scale mock-up office, International Journal of Low-Carbon Technologies 2010, 5, 158-165, Jun. 2010 (Year: 2010).*

Jiangtao Du et. al., A model study of the daylight and energy performance of rooms adjoining an atrium well, World Renewable Energy Congress 2011—Sweden, Low-Energy Architecture (LEA), May 8-13, 2011, Linkoping, Sweden (Year: 2011).*

Fritz et al., "About Radiance", RADSITE, radiance-online.org, last modified Mar. 2, 2016, 2 pages. https://radiance-online.org/about.

Clarke, "The Creeping Shadow on the Map", Maps Mania, Jun. 6, 2014, 5 pages. http://googlemapsmania.blogspot.hk/2014/06/the-creeping-shadow-on-map.html.

"SunCalc", printed Sep. 18, 2017, 2 pages, SunCalc.org© Torsten Hoffmann 2015-2017. https://www.suncalc.org/#/38.9517,-92.3341,4/2017.09.18/10:06/1/0.

"Shadow 3D map in Google Earth", maplandia.com, google maps world gazetteer, printed Sep. 18, 2017, 5 pages, Copyright© 2005-2016 maplandia.com. http://www.maplandia.com/united-states/washington/clallam-county/shadow/shadow-google-earth.html.

"Google Street View Image API Usage Limits", Google Maps APIs, updated, Jun. 7, 2017, printed Sep. 18, 2017, 4 pages. https://developers.google.com/maps/documentation/streetview/usage-limits.

"The Photographer's Ephemeris", Web App,© 2010-2017 Crookneck Consulting LLC, printed Sep. 18, 2017, 1 page. http://app.photoephemeris.com/?ll=16.768800,-3.007300&center=16.7688,-3.0073&z=13&spn=0.08,0.15&dt=20170918151300%2B0000.

"Leading real estate websites in the United States in Nov. 2016, based on market share of visits", Statista, The Statistics Portal, printed Sep. 18, 2017, 3 pages. https://www.statista.com/statistics/270656/us-market-share-of-leading-real-estate-websites/.

"Most popular real estate websites in the United States as of Jul. 2017, based on monthly visits (in millions)", Statista, The Statistics Portal, printed Sep. 18, 2017, 3 pages. https://www.statista.com/statistics/381468/most-popular-real-estate-websites-by-monthly-visits-usa/.

Sonawane et al., "Daylighting estimation and analysis in residential apartment building: GIS based approach", 8th IGRSM International Conference and Exhibition on Remote Sensing & GIS (IGRSM 2016), doi:10.1088/1755-1315/37/1/012024, 12 pages.

* cited by examiner

DAYLIGHT LIVABILITY INDEX FROM IMAGES

BACKGROUND

The present disclosure relates generally to daylight livability indices, and more particularly to using building images to calculate daylight livability indices.

Architects and engineers often consider a daylight factor (e.g., the ratio of the light level inside a structure to the light level outside the structure) when designing buildings and structures. Consumers may consider daylight factors when comparing houses, apartments, or other residences for rent or purchase.

SUMMARY

Embodiments of the present disclosure include a method, computer program product, and system for providing daylight livability indices.

An image of a building is received from a client device. The building in the image is identified. The geo-location of the building is determined. Based on the geo-location, a set of attributes for the building is determined. A user query is received from the client device and, based on a property of the user query, a unit in the building is identified. A daylight livability index for the unit is determined, based on the identified unit and the set of attributes for the building. The user is notified of the DLLI.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
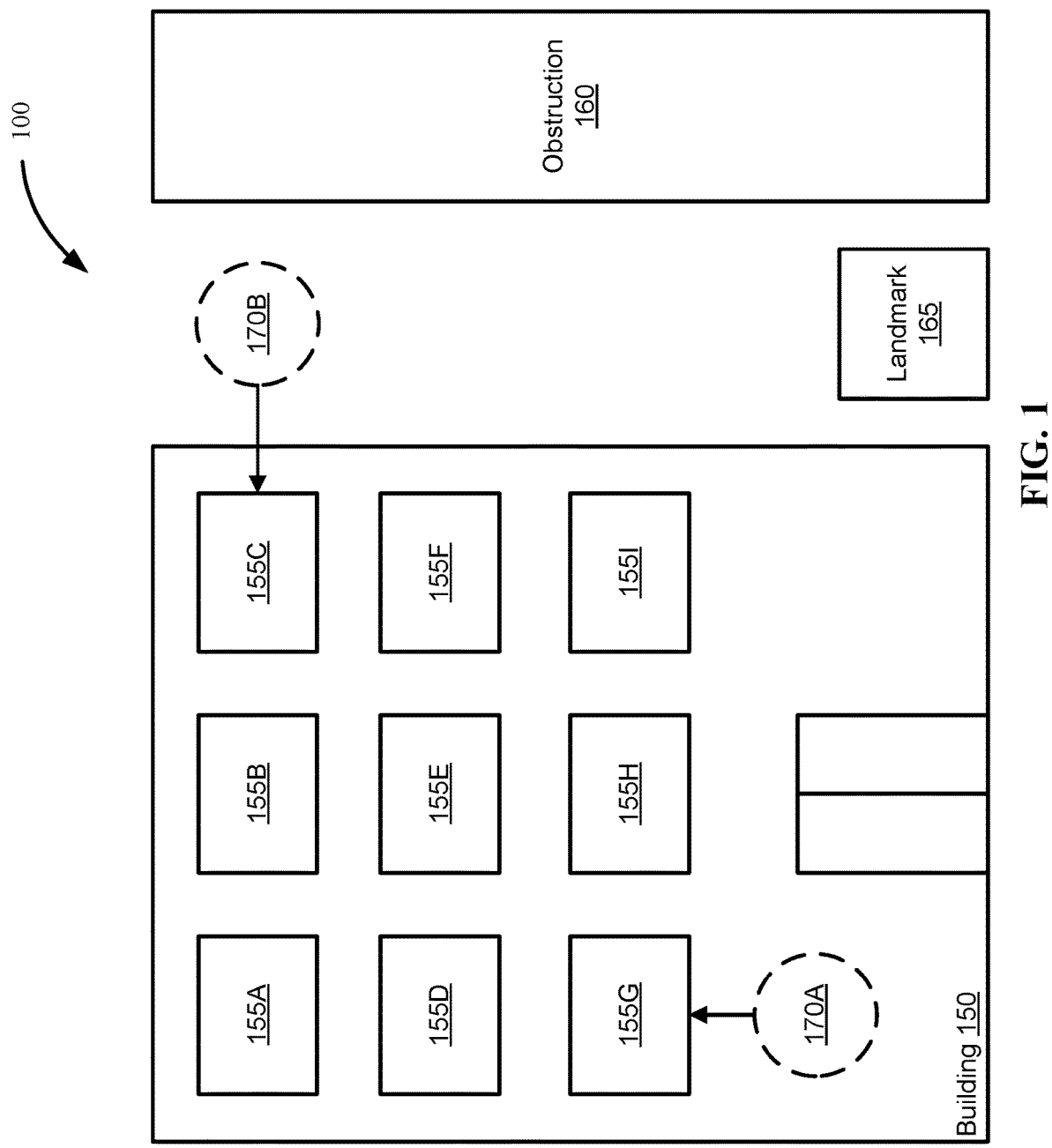
FIG. 1 illustrates an example image with which illustrative embodiments of the present disclosure may be implemented.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of daylight livability indices, and more particularly to using building images to calculate daylight livability indices. While the present disclosure is not necessarily limited to such applications, various aspects of the disclosure may be appreciated through a discussion of various examples using this context.

When a consumer is seeking to rent or purchase a residence, several factors are often taken into account. For example, availability of a residence, location, price, floorplan, the view, the amount of natural light, etc. These factors may be compared among several different options when choosing a residence.

The amount of daylight an apartment, house, or other residence allows to filter inside the dwelling may be an important factor in determining the worth of the property or the appropriate rate of rent. Consumers may consider daylight factors when comparing houses, apartments, or other residences for rent or purchase. For some consumers (e.g., designers, artists, botanists, etc.), daylight factors may be the foremost factor considered when deciding among residence options. Consumers interested in commercial or other types of property may also be interested in daylight factors. For example, a jewelry store or art gallery may benefit from significant amounts of natural lighting.

Reliably and consistently evaluating daylight factors among several residence options may prove difficult for many reasons. Quantifying daylight factors may be difficult for many consumers, and the time of day and season may bias or skew a consumer's evaluation of daylight factors. For example, a consumer who visits a residence at midday during summer may have a very different evaluation of the residence's daylight factor compared to a consumer who visits the same residence in the late afternoon during winter.

Additionally, obstacles outside the residence may impact daylight factor quantification. For example, trees and buildings may obscure the sun at various points in the day, and these obstacles may go unnoticed by a consumer. Further, nearby construction projects (e.g., potential future daylight obstructions) that are being or have been planned, but have not yet been started, may be unknown to the consumer.

Finding residence options and evaluating them also takes a significant amount of time, and a method for automatically and consistently evaluating one or more of the factors that impact a consumer's residence choice, especially one that does not require a tour of the residence, may provide significant time savings.

Embodiments of the present disclosure provide for a method, system, and computer program product for calculating daylight livability indices (DLLIs) for buildings and/or units within those buildings (e.g., apartments or commercial units within a building containing a plurality of apartments/commercial units). DLLI may be calculated/determined, for example, using RADIANCE or similar programs for analyzing lighting in design, and may reflect a composite score representing various factors that impact the amount of daylight a building/unit experiences, such as light intensity and density, daylight duration, unit layout, objects in the vicinity that may that obstruct sunlight, materials used in window and unit construction, time of day, date, weather conditions, sunlight intensity, etc. DLLIs may be determined for an entire building, a unit within the building, and/or a room within the unit.

In embodiments, a user may submit an image or video of a building. The building in the image/video may be identified using elements within the image (e.g., landmarks, street signs, building markers, etc.) and/or using geo-location information, either from the image/video's metadata, or by using Global Positioning System (GPS) coordinates associated with the user's location. For example, if a user, using a smartphone or other mobile device with GPS capabilities, captures an image of a building and immediately submits it for a DLLI evaluation of the building, then the GPS coordinates associated with the smartphone or other mobile device may be used when identifying the building in the image/video.

Various attributes (e.g., attributes that may impact a DLLI calculation) of the building may be determined, either from the image/video itself (e.g., by using image recognition and processing techniques), or by retrieving information for a DLLI calculation from various data sources.

For example, municipal or other government records may be retrieved and analyzed (e.g., using natural language processing (NLP) techniques) to determine the floorplan of the building, which may indicate the number of windows and the layout of the units within the building. The square footage, layout, and window area of a particular unit may directly impact a DLLI calculation.

Municipal and other government records may also contain building permits and other records that may reveal future potential sunlight obstructions. Climate and weather data may be retrieved to calculate DLLIs across various periods of time, such as, for example, across seasons, across months, weeks, days, hours, etc.

In embodiments, a DLLI-providing service may query rental agency, realtor, and other websites to determine whether a property (e.g., house, building, unit, etc.) is available for rent or purchase. In some embodiments, a DLLI-providing service may further query for available properties within a particular proximity or radius of a user or user device (e.g., smart phone, laptop, tablet, or other computing device) and return those results to the user.

In embodiments, a DLLI-providing service may track a user's DLLI notifications (e.g., DLLI calculations displayed to the user) to determine a set of user preferences (e.g., DLLI range, property type, location, cost, etc.). A DLLI-providing service may identify all properties within a particular radius/proximity that meet a user preference threshold (e.g., a property that meets a certain percentage of user preferences or that complies with a certain number of user-defined features in a list of user-defined features, etc.) and notify the user of these properties. In embodiments, notifications may be presented via text message, e-mail, push notification, etc.

In embodiments, a user may submit an image of a building and further submit a query indicating an interest in a particular section of the building or unit within the building. For example, a user may select a window or portion of the building, querying the service for information related to the daylight values for a unit or units corresponding to that window or portion. A DLLI-providing service may identify the particular unit or units within the building that corresponds to the particular window or building portion that the user selected, and return a DLLI for that particular unit (or multiple DLLIs for those particular units).

In embodiments, a DLLI may be presented to the user by superimposing an overlay onto the submitted image, with the DLLI associated with (e.g., imposed directly over, attached with a lead line, etc.) the user-selected window or portion of the building. In embodiments, multiple DLLIs for multiple selections may be displayed.

In some embodiments, the DLLI overlay may be interactive. For example, the displayed DLLI may be a DLLI average for an entire year, and a user interaction with the DLLI may provide a more detailed DLLI report, such as a report indicating average DLLIs over hours, weeks, months, seasons, etc. In embodiments, users may be able to compare DLLIs among several properties.

In embodiments, application programming interfaces (APIs) may be used to enable a DLLI-providing service to be used with other services, such as mapping applications (e.g., GOOGLE STREET VIEW and others).

As discussed above, aspects of the disclosure may relate to the field of daylight livability indices, and more particularly to using building images to calculate daylight livability indices. Accordingly, an understanding of the embodiments of the present disclosure may be aided by describing examples of data collection and data structuring/processing techniques, an example of a building image with a DLLI overlay, etc. Referring now to FIG. 1, illustrated is an example image 100, with which illustrative embodiments of the present disclosure may be implemented. A user may submit image 100 in order to receive DLLIs for one or more units in building 150. Elements 155A-155I may represent windows or portions of the building that correspond to units and/or rooms within building 150. When submitting image 100, a user may concurrently submit a query indicating/selecting one or more elements (e.g., element 155C and/or element 155G) the user has an interest in.

In embodiments, building 150 may be identified using characteristics of image 100, such as landmark 165. Landmark 165 may include, for example, a statue, a street sign, an address identifier, or any other location-specific object. In embodiments, the identification of building 150 may be supplemented or enhanced using geo-location data, as described herein.

After building 150 is identified, a set of attributes for building 150 may be determined, as described herein. Attributes may include, for example, blueprints/floorplans, climate data, and any other data that may impact a DLLI calculation. In embodiments, image 100 may be analyzed to determine attributes. For example, obstructions visible in image 100, such as obstruction 160, may impact the DLLI for one or more units within building 150. Attributes (e.g., from blueprints/floorplans) coupled with the user query (e.g., the selection of one or more of elements 155A-155I) may allow for DLLI calculations for particular units within building 150.

DLLIs may be superimposed over image 100 to notify the user of the DLLIs. DLLI notifications 170A-170B may be visually linked to user-selected elements or directly superimposed over the elements. In embodiments, image 100 may be a street view image from a mapping application, and DLLI indicators 170A-170B may be included in an overlay or otherwise superimposed over the street view image.

Figure 2:
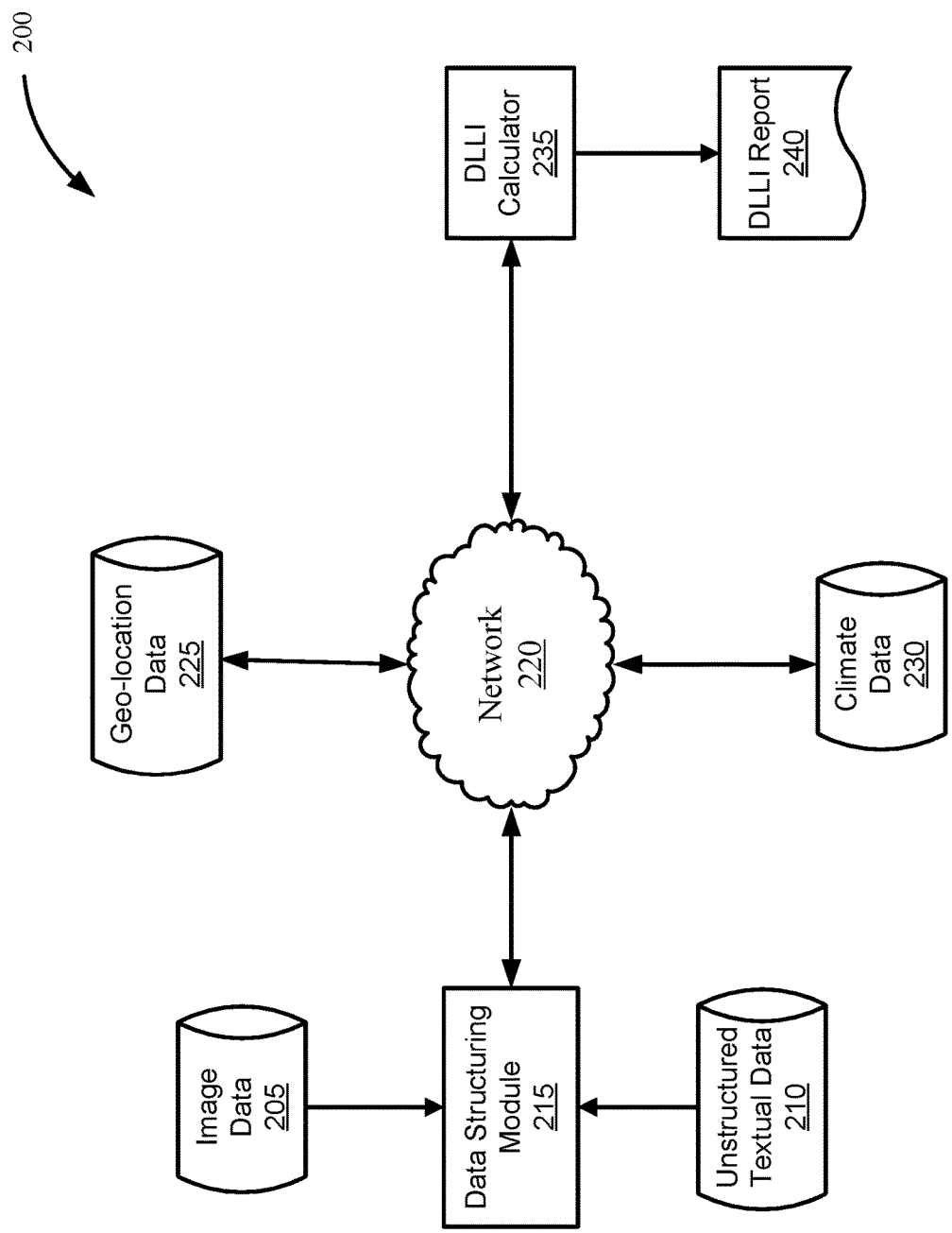
FIG. 2 illustrates a diagram of an example network environment for collecting and structuring data for calculating daylight livability indices and in which illustrative embodiments of the present disclosure may be implemented.

Referring now to FIG. 2, illustrated is a diagram of an example network environment 200 for collecting and structuring data for calculating daylight livability indices, in which illustrative embodiments of the present disclosure may be implemented.

Example network environment 200 may include a plurality of data sources, such as image data 205, unstructured textual data 210, geo-location data 225, and climate data 230. In embodiments, unstructured textual data 210 may include data from a variety of sources, such as, for example, municipal and other governmental sources, as described herein. In certain embodiments, the data sources (e.g., image data 205, unstructured textual data 210, geo-location data 225, and climate data 230, and others) may reside in the storage of a single device, or may be distributed across the storage of a plurality of devices. In embodiments, unstructured textual data 210 and image data 205 may be transmitted to data structuring module 215 via network 220.

In embodiments, a single type of data (e.g., climate data) may reside in the storage of a single device, or may reside in the storage of several devices connected either locally or remotely via a network, such as network 220. In embodiments, the data sources and other devices connected to network 220 may be local to each other, and communicate via any appropriate local communication medium.

Image data 205 may include any images of building(s) captured by a user (e.g., captured with a user's smartphone or other mobile device) or submitted by a user (e.g., an image submitted, for example, via GOOGLE STREET VIEW or other mapping application(s)). In embodiments, image data 205 may further include floorplan images or diagrams, such as, for example, blueprints, plats, etc.

Unstructured textual data 210 may include municipal and other governmental records, such as building permits, applications for building permits, floorplan descriptions, or textual descriptions of properties or units within a building; textual data from realtor or rental agency websites; or any other unstructured textual data that may be structured and used in a determining the DLLI for a building or unit. In embodiments, unstructured textual data may include other data types shown, such as climate data 230 or geo-location data 225. For example, climate and/or weather reports may exist in unstructured form, and may be analyzed/processed by data structuring module 215 and converted into machine-readable data.

Geo-location data 225 may include GPS coordinate data or other positioning system data. Geo-location data may be used to locate a user, to identify a proximity around a user, and/or to aid in identifying a building in an image. For example, to identify a building in an image captured by a user's GPS-enabled mobile device, the GPS coordinates (e.g., geo-location data) of the user's mobile device may be used to identify the location of the building in the image, which may be cross-referenced to a map of the location to identify an address for the building, thereby identifying the building. In embodiments, geo-location data 225 may further include various maps needed for identifying buildings and determining whether sunlight-obstructing obstacles (e.g., landmarks, statues, buildings, structures, mountains, etc.) are nearby.

Climate data 230 may include weather reports, almanac data, and any other data for determining sunlight intensity/density for a particular location. In some embodiments, this climate data may be specific to any location type, such as, for example, a building address, street, city, GPS coordinates, or other location. Climate data 230 may be data regarding weather conditions and sunlight intensity averages for a particular date, time of day, time interval, etc. that may be used in calculating DLLIs.

Data structuring module 215 may include, or be a part of, a device for converting unstructured, raw data (e.g., textual data, images, videos, etc.) into structured data (e.g., machine-readable data) that a computer system, such as DLLI calculator 235, may utilize when evaluating factors that impact a DLLI calculation, as well as calculating the DLLI itself. An embodiment of data structuring module 215 is described in more detail in FIG. 5.

DLLI calculator 235 may include, or be part of, a device for calculating DLLIs, as described herein. For example, DLLI calculator may receive, or retrieve, data from data structuring module 215 and various data sources to use as input into a DLLI calculation, such as, for example, a ray tracer, illumination simulator, or similar programs that may consider a variety of factors, such as unit layout, objects in the vicinity that may that obstruct sunlight, materials used in window and unit construction, time of day, date, weather conditions, sunlight intensity, etc. to determine a total DLLI for a building, a unit within the building, and/or a room within the unit.

DLLI report 240 may include one or more DLLI outputs for a particular property/building/unit/room. In embodiments, DLLI report 240 may include, for example, a number (e.g., an integer on a scale from 0-100) representing the overall/average DLLI for an apartment, a percentage, a graph, or any other representation for representing a daylight factor/ratio. In embodiments, DLLI report 240 may include a DLLI for each room within a unit in addition to an overall DLLI for the entire unit. In embodiments, DLLI report 240 may further include DLLIs over time. For example, DLLI report 240 may include DLLIs for a unit at various times during a given hour, day, week, month, season, year, etc. DLLI report 240 may include, for example, numerical and graphical representations of DLLIs over a given time interval. In embodiments, an overall/average DLLI for a unit may be an average of DLLI calculations over any given time interval, and DLLIs that include drastic or unexpected fluctuations (e.g., a DLLI that fluctuates because the sun is obstructed by a tree/building/landmark during a portion of the day) may be flagged or otherwise include an indicator notifying the user of the fluctuation.

In some embodiments, the various data sources, data structuring module 215, and DLLI calculator 235 may be connected via network 220. The network 220 can be implemented using any number of any suitable communications media. For example, the network 220 may be a wide area network (WAN), a local area network (LAN), an internet, or an intranet. For example, the data structuring module 215 and DLLI calculator 235 and one or more data sources may communicate using a local area network (LAN), one or more hardwire connections, a wireless link or router, or an intranet.

In some embodiments, the data structuring module 215 and DLLI calculator 235 and one or more data sources may be communicatively coupled using a combination of one or more networks and/or one or more local connections. For example, the data structuring module 215 may be hardwired to the DLLI calculator 235 (e.g., connected with an Ethernet cable, hardwired together as components of a larger computer system, etc.), while the data sources may communicate with the data structuring module 215 and DLLI calculator 235 using network 220 (e.g., over the Internet or an intranet).

In embodiments, example network environment 200 may include known, conventional pieces; however, the non-conventional and non-generic association/arrangement of any conventional pieces included therein may provide for the ability to provide DLLI calculations/reports while accounting for DLLI fluctuations and future potential sunlight obstructions.

Figure 3:
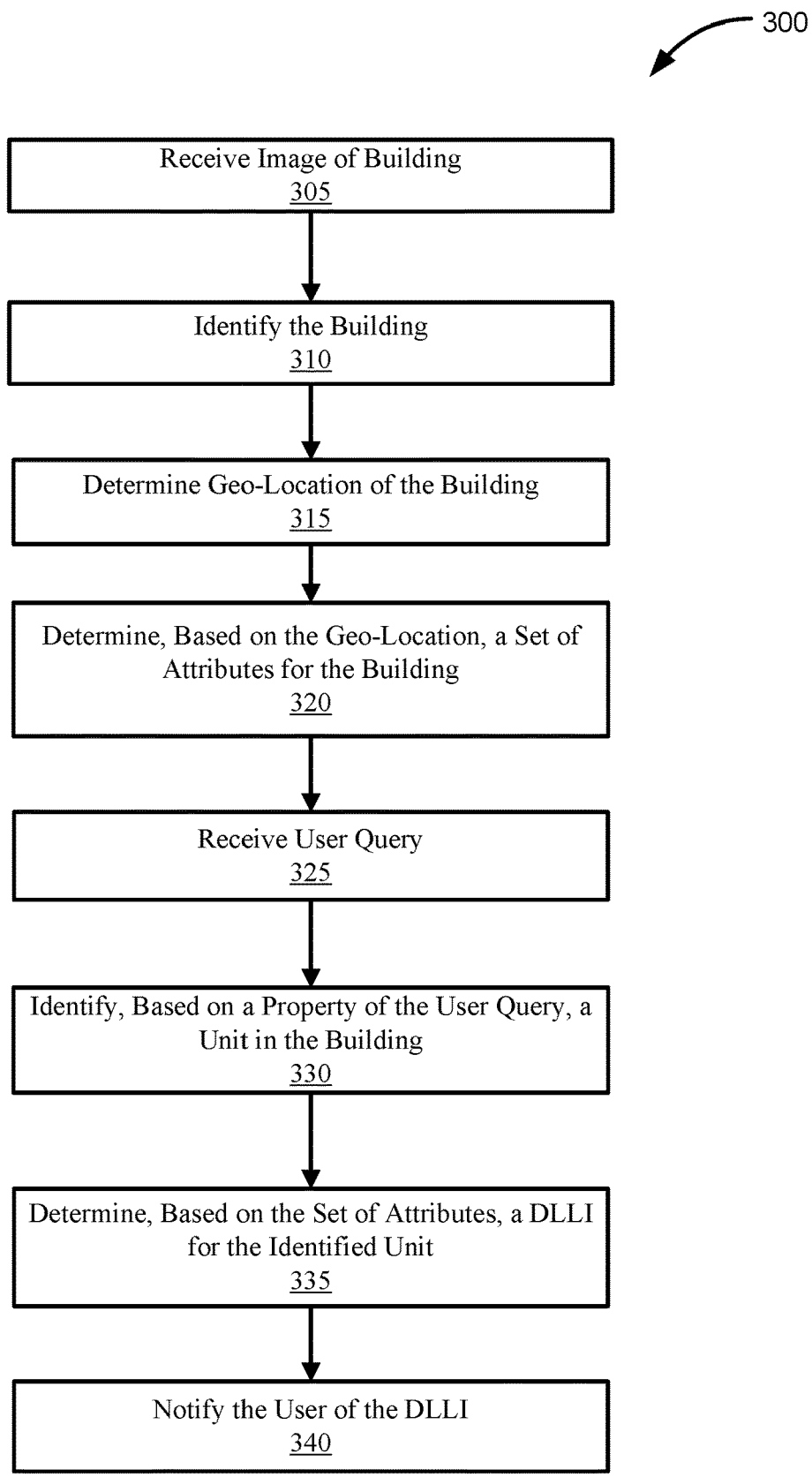
FIG. 3 illustrates a flowchart of a method for calculating a daylight livability index, in accordance with embodiments of the present disclosure.

Referring now to FIG. 3, illustrated is a flowchart of a method 300 for calculating a daylight livability index, in accordance with embodiments of the present disclosure. At 305, an image of a building is received. A building may be, for example, a house, an apartment building, a commercial space, or any other structure into which daylight enters. In embodiments, an image may be a still image, or it may be a series of images (e.g., a video or slideshow). A user may capture the image themselves, or the image may be submitted from an application or website, such as a realtor website, a mapping application, a rental agency website, etc.

At 310, the building is identified. The building may be identified using image recognition techniques to recognize landmarks, street signs, address numbers, etc. from the image. In embodiments where the image is submitted from a mapping application, data from the mapping application may be used to locate and identify the building.

At 315, a geo-location for the building is determined. In embodiments, 315 may be performed before, in conjunction with, or as a part of operation 310. In embodiments, GPS coordinates may be incorporated into the metadata of a digital image to indicate the geo-location of the building, and the building may be identified by querying address records or maps. In embodiments, a GPS-enabled device, such as, for example, a smartphone or tablet, may be used to capture the image, and GPS coordinates of the device may be retrieved via the device to provide a geo-location for the building.

At 320, a set of attributes for the building is determined, based on the geo-location. The geo-location of the building may include the address of the building. The address of the building may be used to query realtor, rental agency, mapping sites, and governmental records to retrieve blueprints/floorplans, other images of the building, information regarding adjacent building, climate data, etc. This information may be used to determine factors that may be used to calculate/determine a DLLI for the building, or for any unit or room within the building. Attributes may include, for example, the square footage, number and size of windows and the direction they face, geometric dimensions, etc. of the building or a unit within the building and may be used in determining a DLLI. Additionally, attributes may include obstructions outside the building, such as trees, statues, nearby buildings, mountains, etc. In embodiments, municipal and other governmental records may be queried to determine whether building permits, building permit applications, or other construction project plans indicate that an obstruction will materialize in the future.

At 325, a user query is received. A user query may indicate a user's interest in a particular section or unit of a building. For example, in embodiments, a user may select a window in the building to indicate that the user would like to see a DLLI for the unit/room that includes that particular window. In embodiments, a user query may indicate a user's interest in multiple sections of one or more buildings. User queries may further contain filtering information. For example, an apartment-hunting user may desire a 3+ bedroom, 2+ bathroom apartment for less than $2,000/month. The user may select one or more sections of one or more buildings with this filtering information to exclude non-compliant apartments (e.g., apartments in that section of the building with fewer than 3 bedrooms, fewer than 2 bathrooms, or that cost more than $2,000/month) from the query results.

At 330, a unit in the building is identified, based on a property of the user query. Properties of the user query may include, for example, the user's interest in a particular section of a building and/or filtering information, as described herein. In embodiments, a properties of the user query may indicate interest in more than one unit within a building.

At 335, a DLLI is determined, based on the set of attributes for the identified unit. Once a particular unit (or set of units) has been identified, a DLLI for the unit(s) may be determined using the set of attributes determined earlier. As described herein, a DLLI may be calculated/determined, for example, using a ray tracer, illumination simulator, etc., for analyzing lighting in design. Such programs may consider various factors (e.g., attributes), such as unit layout, objects in the vicinity that may that obstruct sunlight, materials used in window and unit construction, window size, time of day, date, weather conditions, sunlight intensity, etc.

At 340, the user is notified of the DLLI. As described in reference to FIG. 1A, DLLI notifications may be superimposed over the image of the building in an overlay in a user application, via an API with a preexisting application (e.g., a mapping application), etc. In embodiments, the DLLI notification may be particularly located over a section of the building that the user may have selected or expressed interest in. In embodiments, DLLI notifications may be superimposed over the particular units that they have been calculated/determined for. In embodiments, augmented reality techniques may be used to superimpose DLLI notifications over real time video feeds or interactive visual devices, such as GOOGLE GLASS. In yet other embodiments, DLLI notifications may be delivered to the user via text message, push notification, e-mail, etc. DLLI notifications may include, or be associated with, a DLLI report, such as the DLLI report 240 of FIG. 2.

Figure 4:
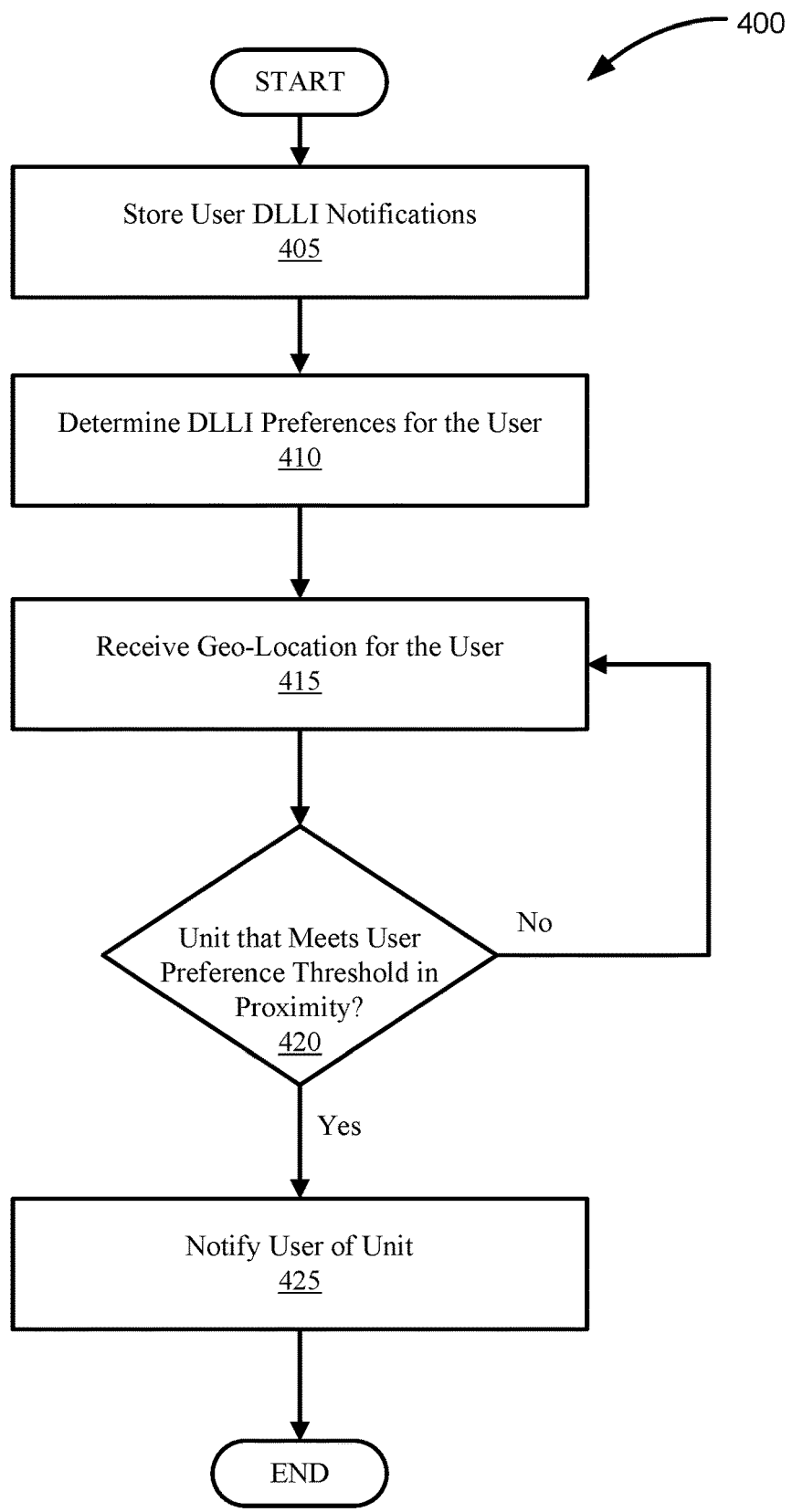
FIG. 4 illustrates a flowchart of a method for notifying a user of nearby units, in accordance with embodiments of the present disclosure.

Referring now to FIG. 4, illustrated is a flowchart of a method 400 for notifying a user of nearby units, in accordance with embodiments of the present disclosure. At 405, DLLI notifications for a user are stored. For example, as notifications are delivered to a particular user, they may be stored/monitored. In embodiments, DLLI notifications may include the set of attributes used to calculate/determine the DLLI.

At 410, DLLI preferences are determined for the user. As DLLI notifications are stored, they may be analyzed to determine trends and identify patterns that may represent the user's preferences regarding the type of building/unit the user is interested in. For example, if a user's DLLI notifications all include DLLIs above 80 (e.g., on a scale of 0-100), the DLLIs are all for single-family houses, and 95% of the houses are priced between $200,000 and $225,000, it may be determined that the user prefers single-family houses with prices ranging from $200,000-$225,000 and with DLLIs ranging from 80-100. In embodiments, as additional DLLI notifications are stored, the determination of user preferences may be re-determined. This may occur at predetermined intervals, or it may occur in real time, as DLLI notifications are generated and stored. In embodiments, user profiles may be used to determine user preferences. For example, a particular user may provide information regarding their preferences, demographic information, etc. that may be used to identify preference trends among a plurality of users that are similar to the particular user, and thereby predict preferences for the particular user based on the preference trends of the plurality of users.

At 415, a geo-location for the user may be received. In embodiments, geo-location for a user may be based on GPS coordinates submitted by a user's mobile device, such as a smartphone, tablet, laptop, etc. In embodiments, geo-location may be determined by location of a router that the user has connected to, such as, for example, a WI-FI router the user's smartphone has connected to.

At 420, it may be determined whether a unit within a proximity to the user meets a preference threshold. The proximity may be a predetermined proximity, or it may be dynamically calculated. For example, the proximity may be a set distance, or it may be determined by the distance a user can travel in a given amount of time. For example, the proximity may be the distance the user can travel in five minutes. This determination may be impacted by the speed at which the user is moving (e.g., walking, biking, driving), which may be determined by analyzing the user's geo-location over time.

A preference threshold may include a representation of the user's preferences and/or user profile information. A preference threshold may enforce total compliance with user preferences (e.g., a units attributes must comply with 100% of the user's preferences), or it may allow for a percentage of compliance with user preferences. For example, a unit that matches/complies with 85% of the user's determined preferences may, in some embodiments, meet the preference threshold.

If, at 420, it is determined that a unit meets the user preference threshold, the user may be notified of the unit at 425. Unit notifications may be executed via text message, push notification, e-mail, augmented reality overlay, etc.

Figure 5:
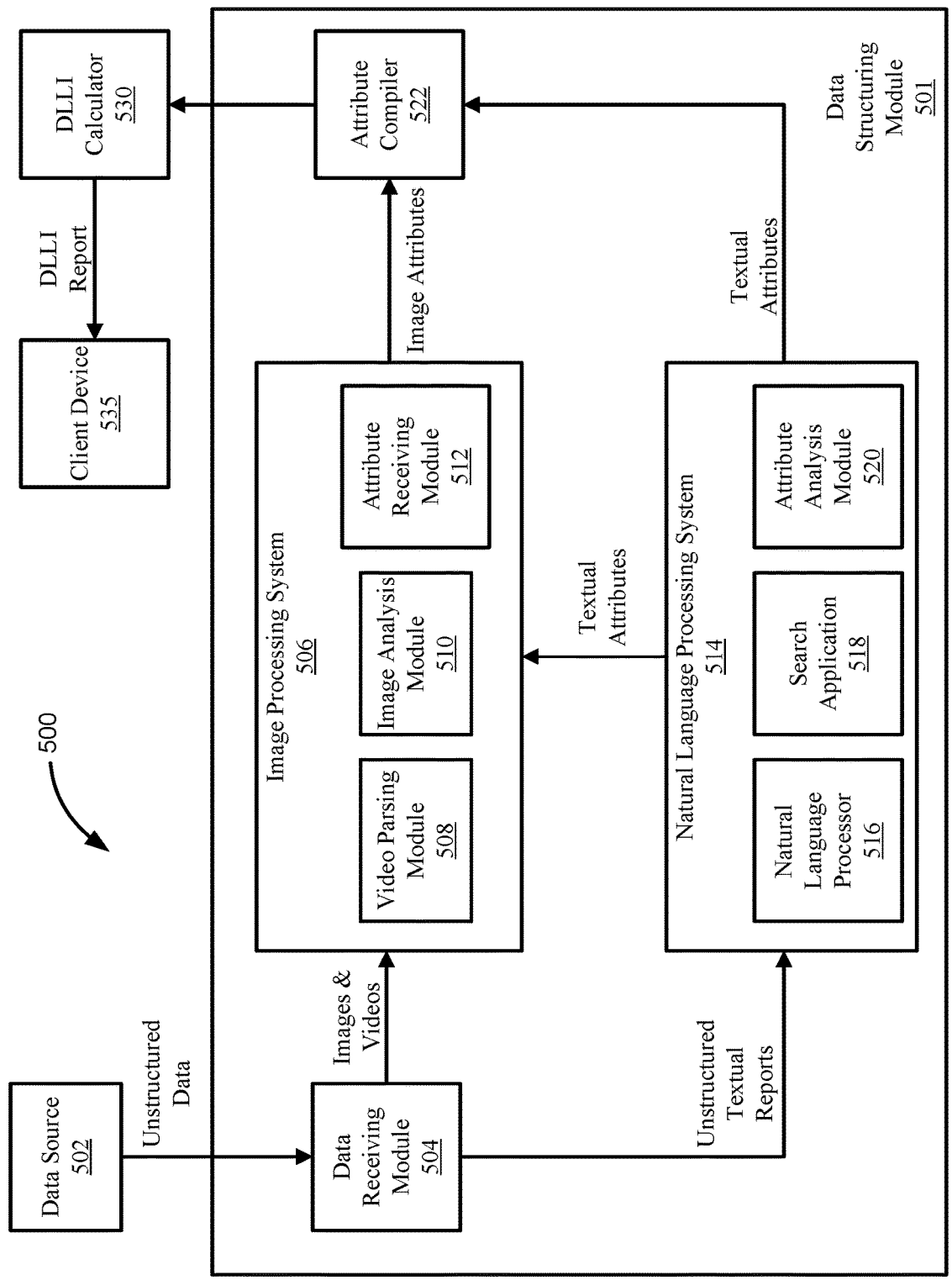
FIG. 5 illustrates a diagram of a data structuring system, in accordance with embodiments of the present disclosure.

Referring now to FIG. 5, illustrated is a diagram of a data structuring system 500, in accordance with embodiments of the present disclosure. In embodiments, the data structuring module 501 and the DLLI calculator 530 may include the same characteristics as the data structuring module 215 and DLLI calculator 235 of FIG. 2, respectively. A data source 502 may be substantially similar to one or more of the various data sources described in FIG. 2 and may submit data to a data receiving module 504. The data may include images/videos (e.g., images/videos of buildings, blueprints/floorplans, maps, etc.) and/or unstructured textual reports (e.g., building permits, textual descriptions of buildings/obstructions, textual descriptions of construction techniques/materials, etc.). The data receiving module 504 may be configured to receive the data and to send image(s) and video(s) to the image processing system 506 and unstructured textual report(s) to the natural language processing system 514. In embodiments, some reports (e.g., building permits, floorplans/blueprints, etc.) may contain both images and text; data receiving module 504 may be configured to parse the data to separate the images and text prior to sending the data to the image processing system 506 or to the natural language processing system 514.

The natural language processing system 514 may include, e.g., a natural language processor 516, a search application 518, and an attribute analysis module 520. Attribute analysis module 520 may include a relational database, triplestore, or text index for identifying terms and phrases associated with attributes. The natural language processing system 514 may be configured to analyze unstructured textual reports to identify one or more textual attributes (e.g., building/unit attributes described textually). After identifying textual attributes, the natural language processing system 514 may transmit the textual attributes to the image processing system 506, as the textual attributes may inform the identification of visual attributes by the image processing system 506. The natural language processing system 514 may also transmit the textual attributes to an attribute compiler 522. In embodiments, natural language processing system 514 may transmit textual attributes directly to DLLI calculator 530.

In some embodiments, the image processing system 506 may include, e.g., a video parsing module 508, an image analysis module 510, and an attribute receiving module 512. The attribute receiving module 512 may be configured to receive, from the natural language processing system 514, textual attributes determined by analyzing one or more unstructured textual reports that are related to images/videos received from data receiving module 504. Based on digital file formats (e.g., image file formats and video file formats), image processing system 506 may determine with which processing module (e.g., video parsing module 508 or image analysis module 510) the system should use to analyze the image/video received from the data receiving module 504. In embodiments, image processing system 506 may further distinguish blueprints/floorplans from still images (e.g., photographs, video frames, etc.) using visual object identification techniques.

In embodiments, video parsing module 508 may be configured to recognize video formats and parse the video into still frame images. In embodiments, a user may select one or more still frame images for processing, or the image processing system 506 may select one or more still frame images for processing. In embodiments, still frame images may be selected at random intervals from the video stream, at regular intervals from the video stream, or a "best image" may be selected according to still image selection criteria (e.g., which still image captures the most of a building). Still frame images may be transmitted to image analysis module 510 for further structuring/processing.

In embodiments, image analysis module 510 may be configured to recognize building attributes in images, and output structured data representations (e.g., machine-readable data) of building attributes. For example, image analysis module 510 may be configured to identify, from a still image, a video, or a single frame of a video feed, building attributes represented in the image or video (e.g., the square footage, number and size of windows and the direction they face, geometric dimensions, etc. of the building, or obstructions outside the building, such as trees, statues, nearby buildings, mountains, etc.).

Attribute receiving module 512 may receive textual attributes identified by the attribute analysis module 520. Textual attributes identified by attribute analysis module 520 may be related to blueprints/floorplans, images, or video processed by image processing system 506. For example, building permit records may contain unstructured text as well as blueprints/floorplans. Data receiving module 504 may parse the building permit records and send the unstructured text portion to the natural language processing system 514 and the blueprints/floorplans to the image processing system 506. Attribute analysis module 520 may include a relational database, triplestore, or text index for identifying terms and phrases associated with attributes. Attribute receiving module 512 may be configured to receive the attributes identified from the textual portion of the parsed building permit records, and combine them with the attributes identified from the diagrams of that same building permit records to ensure that a robust set of attributes for the particular building/unit are identified and grouped together.

After the image processing system 506 has analyzed a received image/diagram/video and/or natural language processing system 514 has analyzed a received unstructured textual report for a building, the set of attributes may, in embodiments, be sent to an attribute compiler 522. Attribute compiler 522 may compare the textual attributes output by natural language processing system 514 with the attributes output by the image processing system 506 to ensure consistency and uniformity among the attributes. Attribute compiler 522 may transmit a complete set of attributes for a building to DLLI calculator 530.

In embodiments, as discussed herein, DLLI calculator 530 may determine a composite score (e.g., a DLLI) representing various factors (e.g. attributes) that impact the amount of daylight a building/unit experiences, such as unit layout, objects in the vicinity that may that obstruct sunlight, materials used in window and unit construction, time of day, date, weather conditions, sunlight intensity, etc. In embodiments, DLLI calculator 530 may calculate DLLIs over a period of time to account for various fluctuations in DLLI values. For example, the movement of obstructions' shadows over a window may cause a sudden decrease in the amount of daylight that enters a particular unit/building, thereby causing a decrease in DLLI until the shadow passes away from the window. DLLI calculator 530 may transmit one or more DLLIs (e.g., a DLLI report) to client device 535.

Client device 535 may be a user's mobile device, laptop, tablet, desktop computer, or any other computing device capable of receiving a DLLI report. As described in reference to FIG. 2, a DLLI report may include, for example, a number (e.g., an integer on a scale from 0-100) representing the overall/average DLLI for a building/unit, a percentage, a graph, or any other representation for representing a daylight factors over time. In embodiments, DLLI report may include a DLLI for each room within a unit in addition to, or instead of, an overall DLLI for an entire unit. In embodiments, a DLLI report may further include DLLIs over time. For example, DLLI report may include DLLIs for a unit at various times during a given hour, day, week, month, season, year, etc. A DLLI report may include, for example, numerical and graphical representations of DLLIs over a given time interval. In embodiments, an overall/average DLLI for a unit, room, or building may be an average of DLLI calculations over any given time interval, and DLLIs that include drastic or unexpected fluctuations (e.g., a DLLI that fluctuates because the sun is obstructed by a tree/building/landmark during a portion of the day) may be flagged or otherwise include an indicator notifying the user of the fluctuation. In embodiments, DLLIs that may be impacted in the future due to construction activity/building permits may also be flagged.

Figure 6:
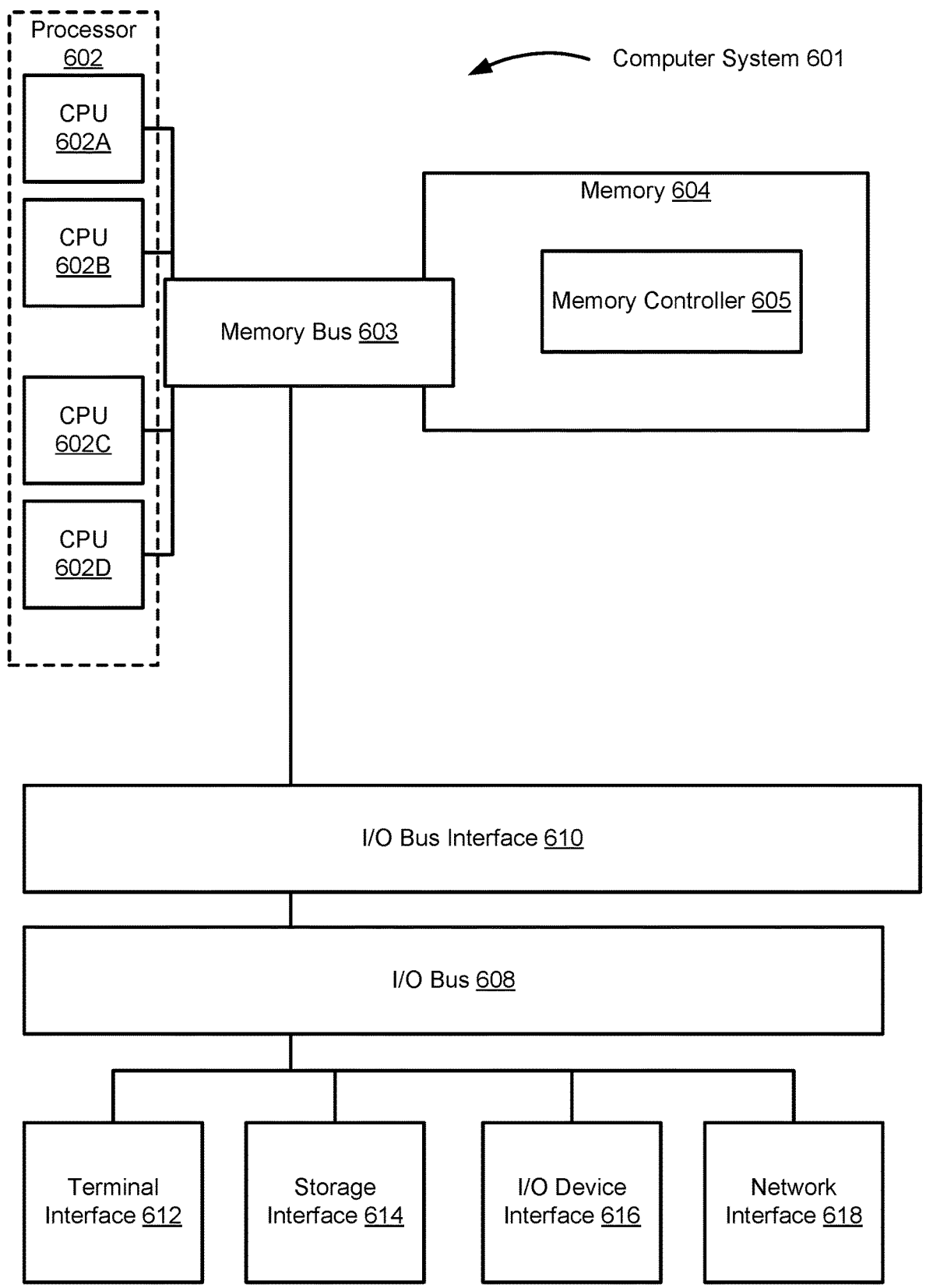
FIG. 6 illustrates a high-level block diagram of an example computer system that may be used in implementing embodiments of the present disclosure.

Referring now to FIG. 6, shown is a high-level block diagram of an example computer system (e.g., computer) 601 that may be configured to perform various aspects of the present disclosure, including, for example, methods 300/400, described in FIGS. 3-4, respectively. The example computer system 601 may be used in implementing one or more of the methods or modules, and any related functions or operations, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 614, an I/O (Input/Output) device interface 616, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may comprise one or more levels of on-board cache.

In some embodiments, the memory subsystem 604 may comprise a random-access semiconductor memory, storage device, or storage medium (either volatile or non-volatile) for storing data and programs. In some embodiments, the memory subsystem 604 may represent the entire virtual memory of the computer system 601, and may also include the virtual memory of other computer systems coupled to the computer system 601 or connected via a network. The memory subsystem 604 may be conceptually a single monolithic entity, but, in some embodiments, the memory subsystem 604 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures. In some embodiments, the main memory or memory subsystem 604 may contain elements for control and flow of memory used by the CPU 602. This may include a memory controller 605.

Although the memory bus 603 is shown in FIG. 6 as a single bus structure providing a direct communication path among the CPUs 602, the memory subsystem 604, and the I/O bus interface 610, the memory bus 603 may, in some embodiments, comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, mobile device, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. may be present, and the number, type, and configuration of such components may vary.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:
1. A method for providing daylight livability indices (DLLIs), the method comprising:
receiving, from a client device, an image of a building;
identifying the building in the image;
determining the geo-location of the building, wherein the geo-location of the building is determined using object recognition techniques on the image to recognize landmarks, street signs, and building markers;

determining, based on the geo-location, a set of attributes for the building;

receiving, from the client device, a user query;

identifying, based on a property of the user query, a unit in the building;

determining, based on the identified unit and the set of attributes for the building, a DLLI for the identified unit, wherein the DLLI includes an interactive report indicating at least an average DLLI over a period of time; and notifying the user of the DLLI;

determining a set of DLLI preferences for the user, the set of DLLI preferences including at least a DLLI range, property type, property location, and property cost;

receiving the user's geo-location;

determining a second unit within a proximity to the user meets a DLLI preference threshold, wherein the proximity is predetermined or the proximity is dynamically calculated; and notifying the user of the second unit.

2. The method of claim 1, wherein the set of attributes for the building includes floorplans for the building, objects outside the building that may affect DLLI determination, and climate information for the building's geo-location.

3. The method of claim 1, wherein the unit comprises several rooms and the DLLI includes DLLI determinations for each room within the unit.

4. The method of claim 1, wherein the image of the building is obtained by selecting a frame of a video, the frame including a best image of the building.

5. The method of claim 4, wherein a second DLLI for a second unit in the building is displayed, wherein the location of the displayed second DLLI in the image of the building corresponds to the location of the second unit in the image of the building.

6. The method of claim 1, wherein the DLLI includes a number, the number representing sunlight density, duration, and intensity for the identified unit.

7. A system for providing daylight livability indices (DLLIs), the system comprising:

a memory; and a processor in communication with the memory, wherein the computer system is configured to perform a method, the method comprising:

receiving, from a client device, an image of a building;

identifying the building in the image;

determining the geo-location of the building, wherein the geo-location of the building is determined using object recognition techniques on the image to recognize landmarks, street signs, and building markers;

determining, based on the geo-location, a set of attributes for the building;

receiving, from the client device, a user query;

identifying, based on a property of the user query, a unit in the building;

determining, based on the identified unit and the set of attributes for the building, a DLLI for the identified unit, wherein the DLLI includes an interactive report indicating at least an average DLLI over a period of time; and notifying the user of the DLLI;

determining a set of DLLI preferences for the user, the set of DLLI preferences including at least a DLLI range, property type, property location, and property cost;

receiving the user's geo-location;

determining a second unit within a proximity to the user meets a DLLI preference threshold, wherein the proximity is predetermined or the proximity is dynamically calculated; and notifying the user of the second unit.

8. The system of claim 7, wherein the set of attributes for the building includes floorplans for the building, objects outside the building that may affect DLLI determination, and climate information for the building's geo-location.

9. The system of claim 7, wherein the unit comprises several rooms and the DLLI includes DLLI determinations for each room within the unit.

10. The system of claim 7, wherein the image of the building is obtained by selecting a frame of a video, the frame including a best image of the building.

11. The system of claim 10, wherein a second DLLI for a second unit in the building is displayed, wherein the location of the displayed second DLLI in the image of the building corresponds to the location of the second unit in the image of the building.

12. The system of claim 7, wherein the DLLI includes a number, the number representing sunlight density, duration, and intensity for the identified unit.

13. A computer program product for providing daylight livability indices (DLLIs), the computer program product comprising a computer readable storage medium having program instructions embodied therewith, the program instructions executable by a device to cause the device to perform a method, the method comprising:

receiving, from a client device, an image of a building;

identifying the building in the image;

determining the geo-location of the building, wherein the geo-location of the building is determined using object recognition techniques on the image to recognize landmarks, street signs, and building markers;

determining, based on the geo-location, a set of attributes for the building;

receiving, from the client device, a user query;

identifying, based on a property of the user query, a unit in the building;

determining, based on the identified unit and the set of attributes for the building, a DLLI for the identified unit, wherein the DLLI includes an interactive report indicating at least an average DLLI over a period of time; and notifying the user of the DLLI;

determining a set of DLLI preferences for the user, the set of DLLI preferences including at least a DLLI range, property type, property location, and property cost;

receiving the user's geo-location;

determining a second unit within a proximity to the user meets a DLLI preference threshold, wherein the proximity is predetermined or the proximity is dynamically calculated; and notifying the user of the second unit.

14. The computer program product of claim 13, wherein the set of attributes for the building includes floorplans for the building, objects outside the building that may affect DLLI determination, and climate information for the building's geo-location.

15. The computer program product of claim 13, wherein the unit comprises several rooms and the DLLI includes DLLI determinations for each room within the unit.

16. The computer program product of claim 13, wherein the image of the building is obtained by selecting a frame of a video, the frame including a best image of the building.

17. The computer program product of claim 16, wherein a second DLLI for a second unit in the building is displayed, wherein the location of the displayed second DLLI in the image of the building corresponds to the location of the second unit in the image of the building.

\* \* \* \* \*